United States Patent [19]
Gordon

[11] 4,152,659
[45] May 1, 1979

[54] LOW NOISE DIFFERENTIAL AMPLIFIER

[75] Inventor: Bernard M. Gordon, Magnolia, Mass.

[73] Assignee: Analogic Corporation, Wakefield, Mass.

[21] Appl. No.: 835,968

[22] Filed: Sep. 23, 1977

[51] Int. Cl.² .............................................. H03F 3/45
[52] U.S. Cl. .......................................... 330/9; 330/51; 330/69; 330/84; 330/108; 330/149; 330/258
[58] Field of Search ................. 330/9, 51, 84, 69, 108, 330/149, 258

[56] References Cited

U.S. PATENT DOCUMENTS

| 3,304,507 | 2/1967 | Weekes et al. | 330/69 X |
| 3,453,554 | 7/1969 | Shoemaker | 330/261 X |
| 3,516,006 | 6/1970 | Donjon | 330/84 X |
| 3,801,924 | 4/1974 | Mueller et al. | 330/69 |
| 3,863,172 | 1/1975 | Sato et al. | 330/69 |

Primary Examiner—James B. Mullins
Attorney, Agent, or Firm—Weingarten, Maxham & Schurgin

[57] ABSTRACT

A low noise differential amplifier circuit which requires only two operational amplifiers and which has lower noise than conventional differential amplifiers. An alternate embodiment is disclosed including circuitry for autozeroing the amplifier.

7 Claims, 3 Drawing Figures

LOW NOISE DIFFERENTIAL AMPLIFIER

FIELD OF THE INVENTION

The present invention relates to differential amplifiers and in particular to differential amplifiers having low noise.

BACKGROUND OF THE INVENTION

In many different circuits, it is frequently necessary to detect and measure very small differential voltages which are present on leads concurrently with relatively large common mode voltages. For example, in scientific instrumentation, signals in the microvolt and tens of microvolt range must frequently be measured at remote locations. Due to capacitive and inductive coupling, AC signals as large as several volts may be coupled into the signal leads from 60 Hz power line. Also, there may be a voltage drop between the transducer ground and ground at the measuring site which contributes to the common mode voltage. Differential amplifier circuits which provide high common mode rejection and low noise are therefore useful circuits.

SUMMARY OF THE INVENTION

The present invention includes a low noise differential amplifier circuit which requires only two operational amplifiers, in contrast to a conventional instrumentation amplifier which requires three operational amplifiers. The present invention has advantages over prior art differential amplifiers in that it has significantly better noise performance. This reduction in noise is partly the result of the elimination of one of the required operational amplifiers and partly due to the unique configuration of the circuit.

DESCRIPTION OF THE DRAWINGS

These and other advantages of the present invention will become more clear upon reading the following detailed description of the present invention in conjunction with the accompanying figures of which.

DETAILED DESCRIPTION OF THE INVENTION

Figure 1:
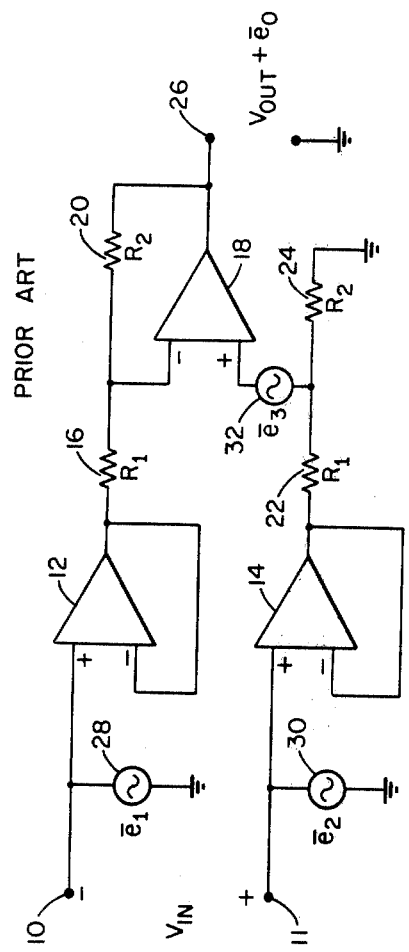
FIG. 1 is a schematic diagram of a prior art instrumentation amplifier.

Instrumentation amplifiers are used where very high input impedance and high common mode rejection are required. FIG. 1 shows the standard differential amplifier which is usually used. An input voltage, $V_{IN}$, is applied between two input terminals 10 and 11. $V_{IN}$ includes two components: a differential voltage, which is normally the voltage to be measured; and a common mode voltage with respect to the differential amplifier ground, which is usually caused by unwanted coupling of extraneous signals.

The input terminals 10 and 11 are connected to the non-inverting inputs of two operational amplifiers 12 and 14. The outputs of op-amps 12 and 14 are connected to the respective inverting inputs thereof, and these amplifiers operate as voltage followers. The output from op-amp 12 is applied via a resistor 16 having a value $R_1$ to the inverting input of a third operational amplifier 18. The output of op-amp 18 is connected to the inverting amplifier via a feedback resistor 20 having a resistance $R_2$. The output from operational amplifier 14 is connected to the non-inverting input of op-amp 18 via a resistor 22 having a value $R_1$; and the non-inverting input is connected to ground via a resistor 24 having a value of $R_2$.

In operation, the differential component of $V_{IN}$ is amplified by the circuit of FIG. 1 and appears at output terminal 26 amplified by a factor equal to $R_2/R_1$. The common mode component of $V_{IN}$ is not amplified by the circuit due to the differential inputs of op-amp 18, and is reduced by a factor equal to the common mode rejection ratio of op-amp 18.

Each of the operational amplifiers 12, 14, and 18 add noise to the input signal. This noise may be modeled as a voltage source in series with one of the inputs of the operational amplifier. Thus, the noise produced by op-amps 12 and 14 may be modeled by noise sources 28 and 30 having respective equivalent noise voltages (the RMS value of the noise as a function of frequency integrated over the bandwidth of the amplifier circuit) of $\overline{e}_1$ and $\overline{e}_2$. The noise contributed by op-amp 18 may be modeled by a third noise source 32 connected in series with the positive input thereof having an equivalent noise voltage of $\overline{e}_3$. The noise contributed by op-amps 12, 14, and 18, represented by the three noise sources 28, 30, and 32, produces an equivalent noise voltage $\overline{e}_0$ at the output terminal 26 of the amplifier circuit. The magnitude of this noise voltage is given by:

$$(e_0)^2 = \left(\frac{R_2}{R_1} e_1\right)^2 + \left(\frac{R_2}{R_1} e_2\right)^2 + \left(\frac{R_1 + R_2}{R_1} e_3\right)^2 \quad (1)$$

Figure 2:
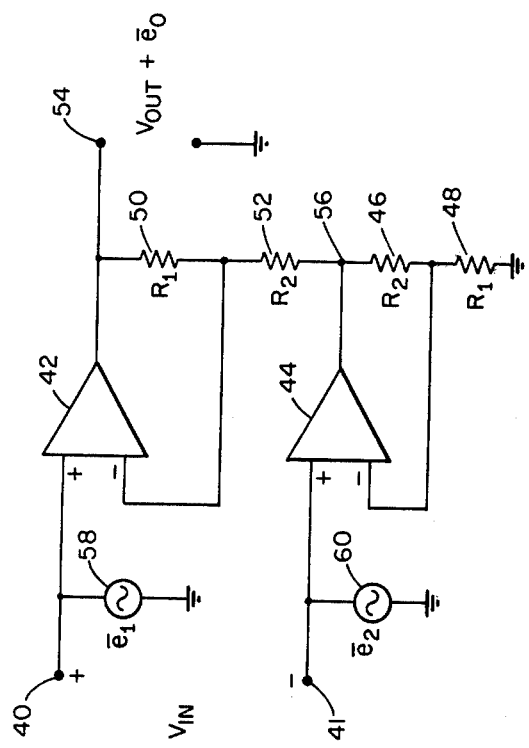
FIG. 2 is a schematic diagram of the present invention in its simplest form.

Referring to FIG. 2, the differential amplifier of the present invention is shown in its simplest form. Again, the input signal is applied to input terminals 40 and 41. Input terminal 40 is connected to the non-inverting input of a first op-amp 42, and input terminal 41 is connected to the non-inverting input of a second op-amp 44. Op-amp 44 is connected as a non-inverting amplifier, the output from op-amp 44 being connected to the inverting input via a resistor 46 having a value $R_2$ and the non-inverting input being connected to ground via a resistor 48 having a value $R_1$. Op-amp 42 is similarly connected as a non-inverting amplifier with the output of op-amp 42 connected to the input via a resistor 50 having a value $R_1$. The non-inverting input of op-amp 42 is connected to the output of op-amp 44 via a resistor 52 having a value $R_2$. The output signal from the differential amplifier shown in FIG. 2 is taken between the output of op-amp 42 and ground.

The gain of the amplifier shown in FIG. 2 may be calculated as follows. First, assume that the output terminal of op-amp 44, denoted in FIG. 2 as node 56, is grounded. Op-amp 42 then appears as a conventional non-inverting amplifier, and the gain from the positive input terminal 40 is $(R_1+R_2)/R_2$.

Next, the gain from the negative input terminal 41 to the output of op-amp 44 at node 56 may be similarly determined, and this gain is equal to $(R_1+R_2)/R_1$. From the output of op-amp 44 to the output terminal 54, op-amp 42 operates as a conventional inverting amplifier, and assuming input 40 is grounded, the gain is equal to $-(R_1/R_2)$. Thus, the overall gain from the negative input terminal 41 to the output terminal 54 may be determined by multiplying the above two factors, and the gain G is equal to:

$$G = \left(\frac{R_1 + R_2}{R_1}\right)\left(-\frac{R_1}{R_2}\right) = -\frac{R_1 + R_2}{R_2} \quad (2)$$

Thus, the amplifier circuit shown in FIG. 2 is a differential amplifier with a gain of $(R_1+R_2)/R_2$ from the positive input terminal 40 and a gain of $-(R_1+R_2)/R_2$ from the inverting input terminal 41.

To determine the equivalent noise $\bar{e}_0$ at the output of the circuit shown in FIG. 2, the noise contributed by each of the op-amps 42 and 44 may again be modeled by noise sources 58 and 60 connected between the non-inverting inputs of these op-amps and ground, as shown in FIG. 2. The calculation of the contribution of the noise in each op-amp to the total noise at the output of the output of the circuit is identical to the gain calculation given above, and the total noise is given by the following equation:

$$(\bar{e}_O)^2 = \left(\bar{e}_1 \cdot \frac{R_1 + R_2}{R_2}\right)^2 + \left(\bar{e}_2 \cdot \frac{R_1 + R_2}{R_2}\right)^2 \quad (3)$$

From a comparison of equations (1) and (3), it can be seen that for equal gains, the circuit of FIG. 2 will always have less noise at the output than the circuit of FIG. 1. This is due to the fact that FIG. 1 requires one more op-amp and the noise in op-amp 18 in FIG. 1 is amplified more than the noise contributed by the other op-amps in these circuits.

To give a practical example, the output noise for each of these circuits shown in FIG. 1 and FIG. 2 will be calculated for the case of a gain of 1.25 and assuming that each operational amplifier has the same noise, $e_A$. For a gain of 1.25, resistors $R_2$ and $R_1$ in the circuit of FIG. 1 must be in the ratio of 5 to 4.

Putting these values into equation (1), the output noise may be calculated as follows:

$$\bar{e}_0 = e_A \sqrt{(1.25)^2 + (1.25)^2 + (2.25)^2} = 2.86 \, e_A \quad (4)$$

Next, the noise for the circuit of the present invention is calculated. For a gain of 1.25, resistors $R_1$ and $R_2$ must be in the ratio 1 to 4. Putting these values into equation (3), the noise at the output of the circuit of FIG. 2 may be calculated to be:

$$e_0 = e_A \sqrt{(1.25)^2 + (1.25)^2} = 1.77 \, e_A \quad (5)$$

Thus, it can be seen that for the example calculated above, the noise at the output of the circuit of FIG. 2 is less than the noise at the output of the circuit of FIG. 1 by a factor of 1.62. It should be noted that the circuit of FIG. 1 has one disadvantage to the circuit of FIG. 1 in that the allowable common mode voltage present at the input is less than the allowable common mode voltage for the circuit of FIG. 1.

Figure 3:
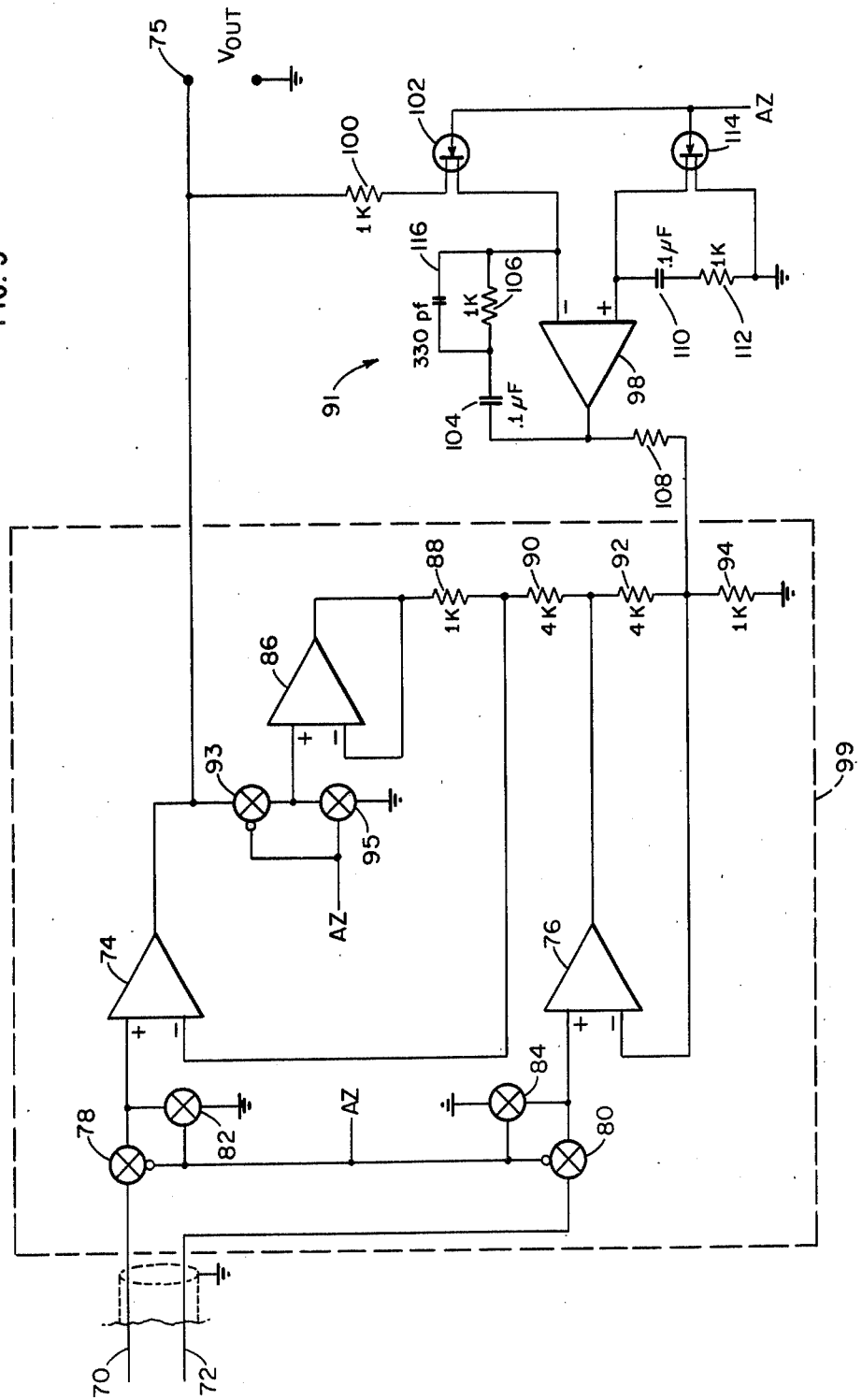
FIG. 3 is a detailed schematic diagram of one embodiment of the present invention, including autozeroing circuitry.

Referring to FIG. 3, there is shown an alternate embodiment of the differential amplifier of the present invention incorporating autozeroing circuitry. The input signal is applied to the amplifier along a cable 70. Typically, this cable is a two-conductor shielded cable with the two conductors 70 and 72 being connected to the non-inverting inputs of operational amplifiers 74 and 76 via switches 78 and 80. The non-inverting inputs to op-amps 74 and 76 are also each connected to ground via switches 82 and 84. Switches 78-84 are controlled by an autozero (AZ) signal. During autozero cycles, the AZ signal is high, causing switches 78 and 80 to open, disconnecting the input signal on lines 70 and 72 from op-amps 74 and 76, and causing switches 82 and 84 to close, connecting the inputs to these op-amps to ground.

The output from the differential amplifier of FIG. 3 is taken from the output of op-amp 74. While the differential amplifier is amplifying, between autozero cycles, this output signal is also applied to the non-inverting input of an op-amp 86 via switch 93. Op-amp 86 has its output connected to the inverting input thereof and acts as a unity gain buffer amplifier. The output from op-amp 86 is applied to a resistive divider made up of resistors 88, 90, 92, and 94. The signal at the junction of resistors 88 and 90 is applied to the inverting input of op-amp 74; the output signal from op-amp 76 is applied to the junction of resistors 90 and 92; and the signal at the junction of resistors 92 and 94 is applied to the inverting input of op-amp 76. Thus, the circuit within box 99 is identical with the circuit shown in FIG. 2 and described above, with the exception of the autozero switches and buffer amplifier 86. The remaining circuit composes the autozero circuitry and serves to provide the autozero compensating signals.

To begin an autozero cycle, the AZ signal goes high. As described above, the input signal is disconnected from op-amps 74 and 76, and the inputs thereto are grounded. The AZ signal is also applied to switches 93 and 95. During an autozero cycle, switch 93 opens, disconnecting the differential amplifier feed-back, and switch 95 closes, grounding the input to op-amp 86. Any offset voltages present in amplifiers 76 and 86 are applied to the inverting input of amplifier 74 via resistors 90 and 88. Similarly, due to the grounding of the non-inverting input of op-amp 74 via switch 82 during the autozero cycle, the offset voltage of op-amp 74 is effectively added to these inputs. Due to the breaking of the feedback loop around op-amp 74 by the opening of switch 92, op-amp 74 operates during autozero cycles in open-loop mode; and the offset voltages applied to its inputs are multiplied by the high open-loop gain of op-amp 74 and appear at the output terminal 75 of the differential amplifier.

The output of the differential amplifier is connected to an integrator circuit 91 via a resistor 100 and FET switch 102. Integrator 91 includes an op-amp 98 whose output is connected to its input via series-connected capacitor 104 and resistor 106. When the AZ signal goes high to begin an autozero cycle, the amplified offset voltages present at output terminal 75 are applied to the input of op-amp 98 via FET switch 102. This voltage at the input of op-amp 98 is integrated, produing a voltage at the output thereof which is applied to the junction of resistors 94 and 92 via a resistor 108. The net effect of this is that the voltage present at the output of integrator circuit 91 is summed with the other offset voltages produced by op-amps 74, 76, and 86, and this sum is applied to the input of op-amp 74. Due to the high gain of op-amp 74, the output signal from integrator 91 is driven to a value which compensates for the offset in the differential amplifier circuit. At the end of the autozero cycle, FET switch 102 disconnects the input of integrator 91 from output terminal 75, and the voltage stored in integrator 91 continues to provide a signal compensating for the offsets in the differential amplifier.

Due to capacitive coupling through FET switch 102, a small error charge may be injected into the input of integrator 91 due to the switching transient produced by the AZ signal going from high to low. To compensate for this, the non-inverting input of op-amp 98 is connected to ground through a capacitor 110 and resistor 112 respectively equal in value to capacitor 104 and resistor 106. A FET switch 114 is connected between the non-inverting input of op-amp 98 and ground. During autozero cycles, the high AZ signal turns on FET switch 114, connecting the non-inverting input of op-amp 98 directly to ground. When the AZ signal goes low, any spurious charge which is capacitively coupled through FET switch 102 into the input of integrator 91 will be compensated for by an equal charge coupled through FET switch 114 into the non-inverting input of op-amp 98. Similarly, any drift in the output of integrator 91 tending to occur due to the discharging of capacitor 104 by the bias current of op-amp 98 is canceled by an identical discharge of capacitor 110. The differential voltage applied to op-amp 98 remains the same and the output does not drift. A capacitor 116 may be connected across resistor 106 to optimize the frequency performance of integrator 91, if desired.

There has been described a novel differential amplifier circuit which has advantages over differential amplifiers previously known in the art. It should be appreciated that in applying the teachings of the present invention to different applications, modifications may be made by those of ordinary skill in the art which do not fall outside the scope of the invention. Therefore, the exemplary embodiments described herein are not to be taken as limitations on the present invention, and the scope of the invention is to be determined in accordance with the appended claims.

What is claimed is:

1. A low noise differential amplifier for amplifying the differential mode component of an input voltage applied to first and second signal input terminals thereof, comprising:

first and second operational amplifiers;

each of said operational amplifiers having an inverting and a non-inverting input terminal;

a first signal input terminal being connected to the non-inverting input of the first operational amplifier and a second signal input terminal being connected to the non-inverting input of the second operational amplifier;

the output of the first operational amplifier being connected to the inverting input thereof through a series resistor of a first resistance value;

the output of the second operational amplifier being connected directly to the inverting input thereof through a series resistor of a second resistance value;

the output of the second operational amplifier being connected through a resistor of said second resistance value to the inverting input of the first operational amplifier;

the inverting input of the second operational amplifier being connected directly to ground through a resistor of said first resistance value;

the output voltage of the differential amplifier appearing between the output of said first operational amplifier and ground; and autozeroing circuitry including:

first switching means operative in a first state to couple an input voltage to said signal input terminals, and operative in a second state to disconnect said non-inverting inputs of said first and second operational amplifiers from said input voltage and to connect the non-inverting inputs to ground during an autozero interval;

buffer amplifier means coupling the output of said first operational amplifier to the non-inverting input thereof and including;

second switching means operative during an autozero interval to ground the input of said buffer amplifier and disconnect the input of said buffer amplifier from the output of said first operational amplifier; and integrator means operative during an autozero interval to connect the output of the first operational amplifier directly to the inverting input of the second operational amplifier.

2. The differential amplifier of claim 1, wherein said buffer means includes:

a third operational amplifier having an inverting and a non-inverting input terminal, the output of the third operational amplifier being connected to the inverting input terminal thereof;

the output of said third operational amplifier being connected to said series resistor of a first resistance value;

the non-inverting input terminal of the third operational amplifier being connected via said second switching means to the output of said first operational amplifier.

3. The differential amplifier of claim 2 wherein said integrator means includes:

a fourth operational amplifier having an inverting and a non-inverting input terminal, the output of the fourth operational amplifier being capacitively coupled to the inverting input thereof;

third switching means operative during an autozero interval to couple the output of the first operational amplifier to the inverting input of the fourth operational amplifier and connecting the non-inverting input of the fourth operational amplifier to ground.

4. The differential amplifier of claim 3 wherein said integrator means further includes a first series resistor capacitor network connecting the non-inverting input of the fourth operational amplifier to ground except during an autozero interval; and a second series resistor capacitor network connecting the output of the fourth operational amplifier to the inverting input thereof, and equal in capacitance and resistance value to the respective values of the first network.

5. The differential amplifier of claim 10 wherein said third switching means includes:

a first solid state switch coupling the output of the first operational amplifier to the inverting input of the fourth operational amplifier; and a second solid state switch in shunt with the first series network.

6. The differential amplifier of claim 1 wherein said first switching means includes for each of said first and second operational amplifiers:

a solid state switch coupling the non-inverting input of the corresponding operational amplifier to a respective one of the signal input terminals;

a solid state switch coupling the non-inverting input of the corresponding operational amplifiers to ground; and means for providing control signals to the solid state switches to disconnect the first and second operational amplifiers from the signal input terminals and to ground the non-inverting inputs thereof.

7. The differential amplifier of claim 1 wherein said second switching means includes:
a solid state switch coupling the output of the first operational amplifier to the non-inverting input of the third operational amplifier;
a solid state switch coupling the non-inverting input of the third operational amplifier to ground; and
means for providing control signals to the solid state switches of said second switching means which during an autozero interval ground the non-inverting input of the third operational amplifier and disconnect that input from the output of the first operational amplifier.

* * * * *

UNITED STATES PATENT AND TRADEMARK OFFICE
CERTIFICATE OF CORRECTION

PATENT NO. : 4,152,659
DATED : May 1, 1979
INVENTOR(S) : Bernard M. Gordon

It is certified that error appears in the above-identified patent and that said Letters Patent are hereby corrected as shown below:

Column 6, line 53, "claim 10" should read --claim 4-- .

Signed and Sealed this

Twelfth Day of February 1980

[SEAL]

Attest:

SIDNEY A. DIAMOND

Attesting Officer

Commissioner of Patents and Trademarks